(12) United States Patent
Hsu et al.

(10) Patent No.: US 7,795,735 B2
(45) Date of Patent: Sep. 14, 2010

(54) METHODS FOR FORMING SINGLE DIES WITH MULTI-LAYER INTERCONNECT STRUCTURES AND STRUCTURES FORMED THEREFROM

(75) Inventors: Chao-Shun Hsu, San-Shin (TW); Chen-Yao Tang, Hsin-Chu (TW); Clinton Chao, Hsinchu (TW); Mark Shane Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 301 days.

(21) Appl. No.: 11/689,264

(22) Filed: Mar. 21, 2007

(65) Prior Publication Data

US 2008/0233710 A1     Sep. 25, 2008

(51) Int. Cl.
*H01L 23/48*   (2006.01)
*H01L 23/52*   (2006.01)
*H01L 29/40*   (2006.01)
*H01L 21/46*   (2006.01)
*H01L 21/4763* (2006.01)

(52) U.S. Cl. ............... 257/758; 257/777; 438/455; 438/618

(58) Field of Classification Search ............... 438/455, 438/618; 257/E25.006, 777, 758
See application file for complete search history.

(56) References Cited

U.S. PATENT DOCUMENTS

| | | | | |
|---|---|---|---|---|
| 5,903,239 | A | * | 5/1999 | Takahashi et al. ...... 343/700 MS |
| 6,002,177 | A | * | 12/1999 | Gaynes et al. ............... 257/774 |
| 2004/0102019 | A1 | * | 5/2004 | Jarvis et al. ................. 438/455 |
| 2006/0223301 | A1 | * | 10/2006 | Vanhaelemeersch et al. 438/618 |

* cited by examiner

*Primary Examiner*—William M. Brewster
(74) *Attorney, Agent, or Firm*—Duane Morris LLP

(57) ABSTRACT

A method for forming a single die includes forming at least one first active device over a first substrate and at least one first metallic layer coupled to the first active device. At least one second metallic layer is formed over a second substrate, wherein the second substrate does not include any active device. The at least one first metallic layer is bonded with the at least one second metallic layer such that the first substrate and the second substrate constitute a single die.

17 Claims, 10 Drawing Sheets

METHODS FOR FORMING SINGLE DIES WITH MULTI-LAYER INTERCONNECT STRUCTURES AND STRUCTURES FORMED THEREFROM

BACKGROUND OF THE INVENTION

1. Field of the Invention

The present invention relates, most generally, to methods for forming semiconductor structures and structures formed therefrom, and more particularly to methods for forming a die with a multi-layer interconnect structure and structures formed therefrom.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements. In order to achieve high-speed performance, dimensions of transistors have been shrinking. Also, multi-layer interconnect structures have been proposed and/or used to provide desired operational speeds of transistors.

FIG. 1 is a schematic cross-sectional view showing a traditional single die with a multi-layer interconnect structure.

Referring to FIG. 1, the single die 101 has a device 102 formed over a substrate 100. Dielectric layers 110, 130, 140 and 150 are sequentially formed over the substrate 100. Contacts/vias 109, 133, 143 and 153 are formed within the dielectric layers 110, 130, 140 and 150, respectively. Metallic layers 111, 135, 145 and 155 are formed over the dielectric layers 110, 130, 140 and 150, respectively. The contacts 109 contact source/ drain regions 107 of the device 102.

Different layers of the single die 101 are subjected to particles/defects contamination. Particles kill yields of wafers if they fall on different dies in different device layers or metallic layers. The issue becomes more serious when the number of metallic layers increases and the dimensions of devices and metallic layers shrink.

Based on the foregoing, methods and structures for forming dies with multi-layer interconnect structures are desired.

SUMMARY OF THE INVENTION

In accordance with some exemplary embodiments, a method for forming a single die includes forming at least one first active device over a first substrate and at least one first metallic layer coupled to the first active device. At least one second metallic layer is formed over a second substrate, wherein the second substrate does not include any active device. The at least one first metallic layer is bonded with the at least one second metallic layer such that the first substrate and the second substrate constitute a single die.

In accordance with some exemplary embodiments, a single die includes at least one first active device coupled to at least one first metallic layer formed over a first substrate. At least one second metallic layer is formed over a second substrate, wherein the second substrate does not include any active device and the at least one first metallic layer is bonded with the at least one second metallic layer such that the first substrate and the second substrate constitute a single die.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DETAILED DESCRIPTION OF EXEMPLARY EMBODIMENTS

Figure 1:
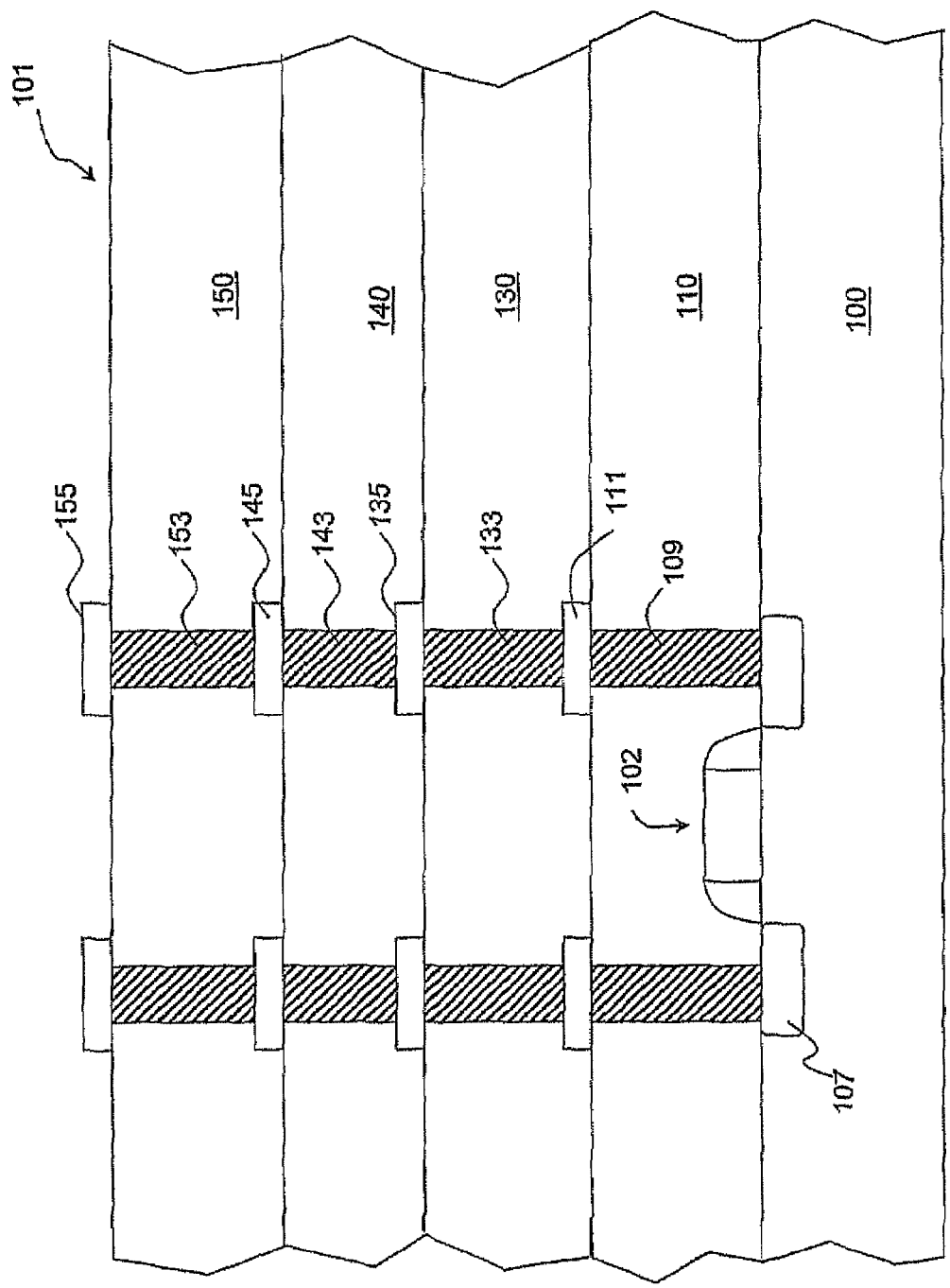
FIG. 1 is a schematic cross-sectional view showing a traditional single die with a multi-layer interconnect structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

Examples are described below in which processing of a single die is divided between two substrates, which are subsequently joined to form the single die. In some embodiments, a first substrate undergoes front-end-of-line (FEOL) processing; a second substrate undergoes back-end-of-line (BEOL) processing; and the two are joined to form a complete die. In other embodiments, a first substrate undergoes some of the FEOL processing; a second substrate undergoes the remainder of the FEOL processing and the BEOL processing; and then the two substrates are joined. In still other embodiments, a first substrate undergoes the FEOL processing and some of the BEOL processing; the second substrate undergoes the remainder of the BEOL processing; and the two are joined.

Figure 2A:
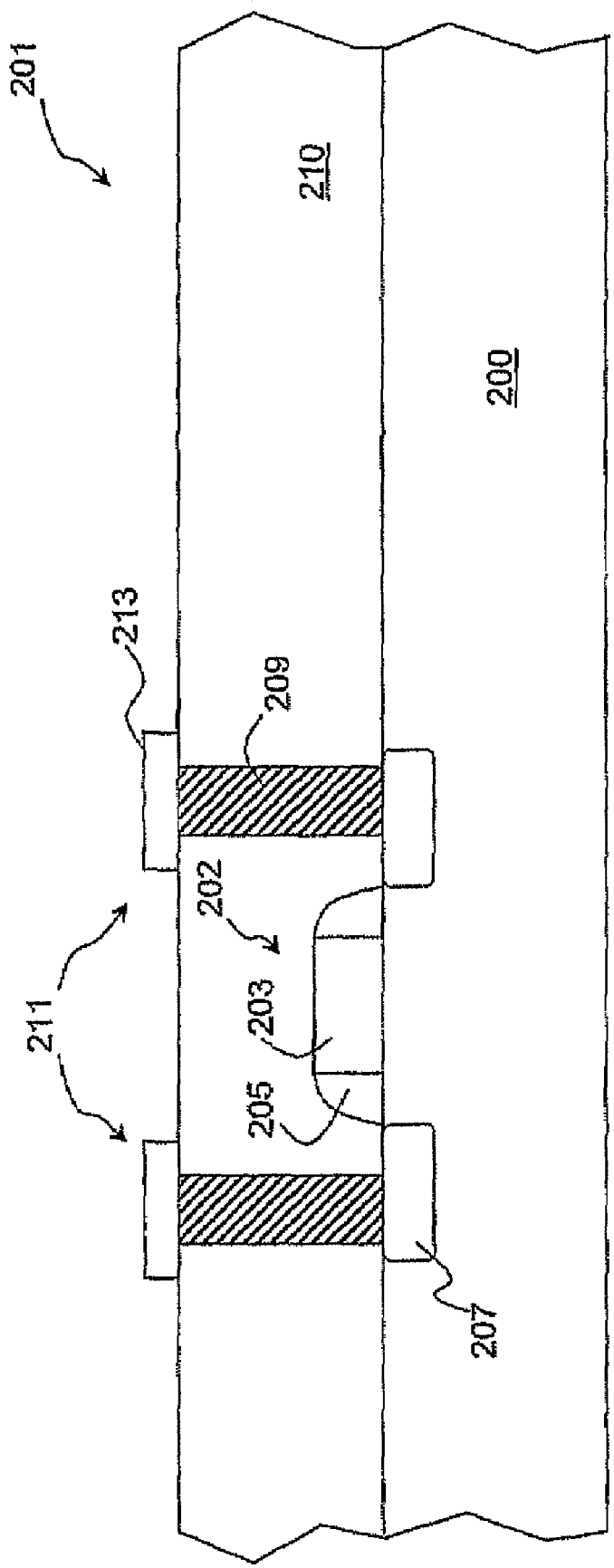
FIGS. 2A-2C are schematic cross-sectional views showing an exemplary method for forming an exemplary single die.
Figure 2B:
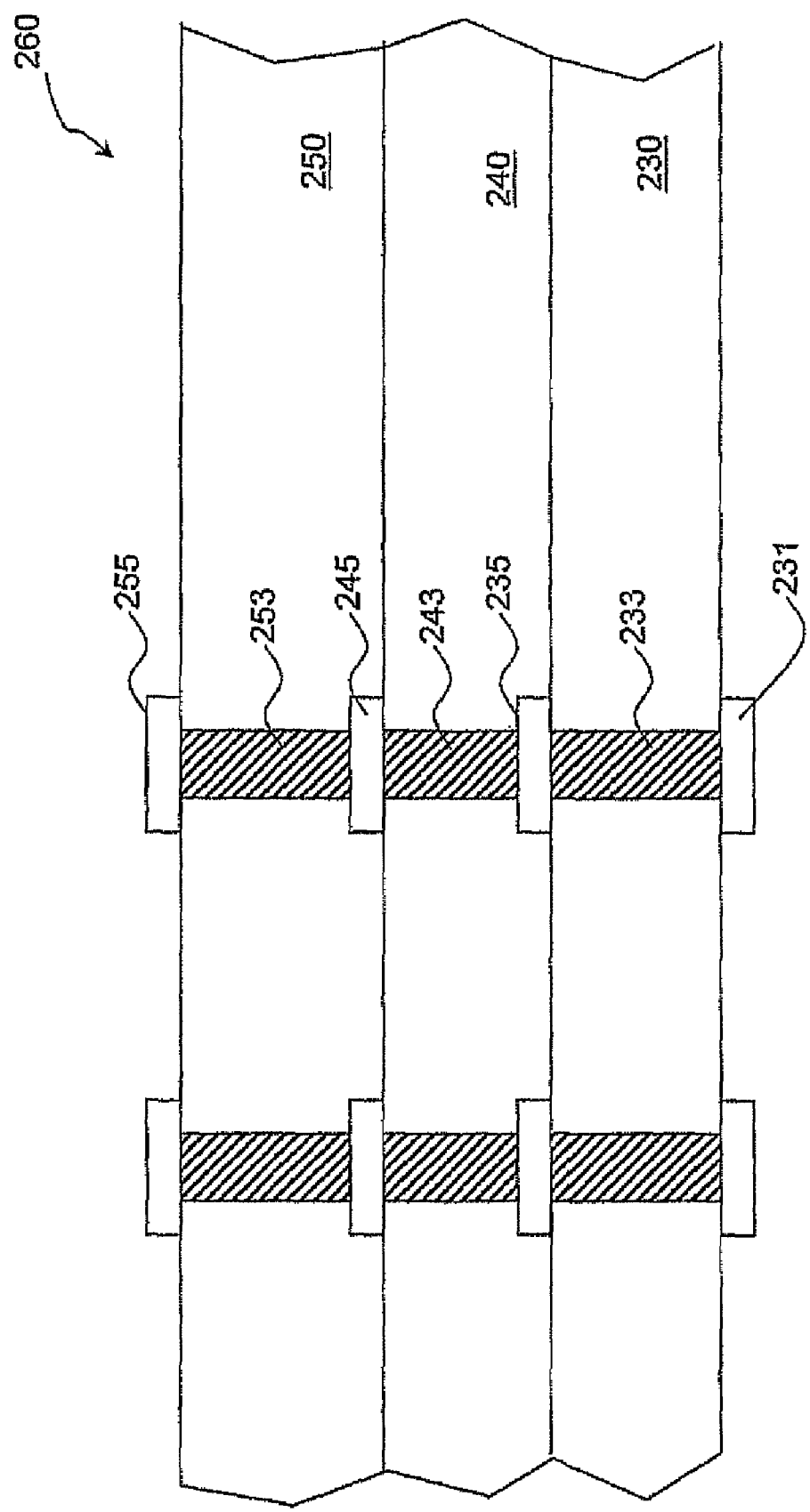
Figure 2C:
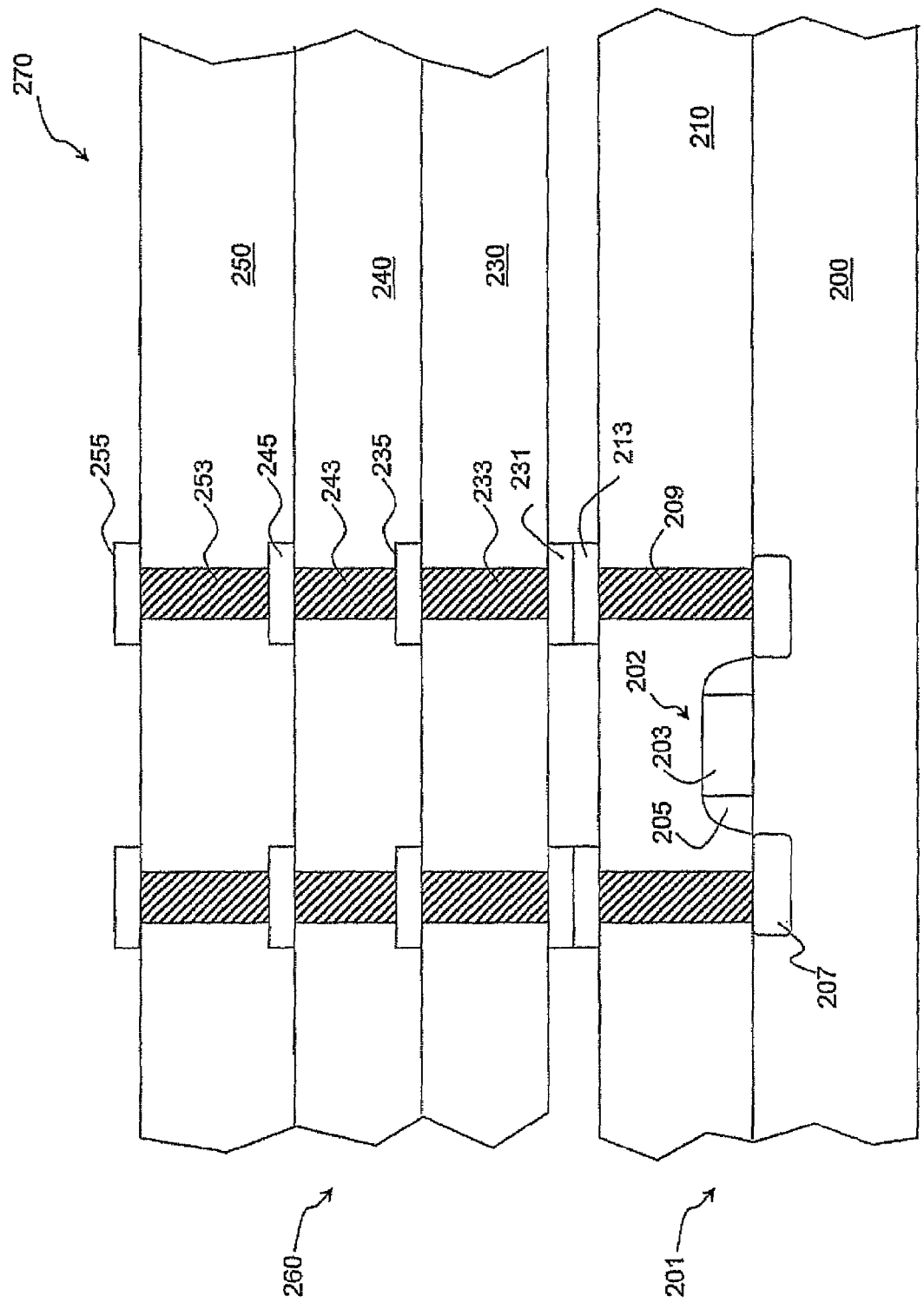

FIGS. 2A-2C are schematic cross-sectional views showing an exemplary method for forming an exemplary single die.

FIG. 2A is an example of a substrate that undergoes front-end-of-line (FEOL) processing, but not back-end-of-line (BEOL) processing. Referring to FIG. 2A, at least one active device 202 is formed over a substrate 200. The active device 202 may comprise a gate 203, spacers 205 and source/drain (S/D) regions 207. A dielectric layer 210 is formed, covering the active device 202. Contacts 209 are formed within the dielectric layer 210, contacting the S/D regions 207. At least one metallic layer 211 is formed over the dielectric layer 210, electrically coupled to the SI D regions 207 through the contacts 209.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example.

The active device 202 may be a P-N junction diode, a transistor, a metal-oxide-semiconductor field effect transistor (MOSFET), a bipolar transistor, a P-N-P or N-P-N transistor, an amplifier, a transmitter, device may covert a signal into another signal or the like, or various combinations thereof. In the embodiment shown in FIG. 2A, the active device 202 is a MOSFET. The gate 203 may comprise a conductive material such as, polysilicon, amorphous silicon, metallic material, (e.g., copper, cobalt, nickel, tungsten or the like), salicide material, or the like, or various combinations thereof. The gate 203 may be formed by, for example, a chemical vapor deposition (CVD) method, a physical vapor deposition (PVD) method, or the like. The spacers 205 may be a material such as oxide, nitride, oxynitride, other dielectric materials or combinations thereof. The spacers 205 may be formed by, for example, a CVD method. The S/D regions 207 may comprise dopants such as boron, phosphorus, arsenic, or the like The S/D regions 207 may be formed by, for example, an ion implantation method. The dielectric layer 210 may be a material such as oxide, nitride, oxynitride, low-k dielectric material, or the like, or various combinations thereof. The dielectric layer 210 may be formed by, for example, a CVD method, a spin-coating method or other adequate methods. The contacts 209 may be a material such as, aluminum, copper, aluminum-copper, tungsten, polysilicon or other adequate conductive materials. The contacts 209 may be formed by, for example, a CVD method, a PVD method, an electroplating method, an electroless plating method or other adequate methods. The metallic layer 211 may be a material such as, aluminum, copper, aluminum-copper, tungsten or other adequate conductive materials. The metallic layer 211 may be formed by, for example, a CVD method, a PVD method, an electroplating method, an electroless plating method or other adequate methods. In some embodiments, the metallic layer 211 may comprise a conductive route over the dielectric layer 210 so as to electrical connect devices, diodes, transistors and/or circuits formed over the substrate 200. In some embodiments, the metallic layer 211 may include pads 213 such as bonding pads for electrically bonding with other substrate, e.g., the substrate 230 shown in FIG. 2B.

Though FIG. 2A merely shows a single metallic layer, the scope of the invention is not limited thereto. The metallic layer 211 may include more than one layers. Thus, in other embodiments, the substrate may undergo FEOL processing and some (but not all) of the BEOL processing.

FIG. 2B is an example of a substrate that undergoes BEOL processing, but not FEOL processing. Referring to FIG. 2B, at least one metallic layer such as metallic layers 235, 245 and 255 are sequentially formed over a substrate 230. Conductive structures 243 and 253 are formed within dielectric layers 240 and 250, respectively, for electrical connection of the metallic layers 235, 245 and 255. The metallic layers 235, 245 and 255 may comprise conductive routes (not shown) such that the metallic layers 235, 245 and 255 are electrically coupled to each other. Conductive structures 233, e.g., through-silicon-via (TSV) structures, are formed within and through the substrate 230. Pads 231 such as bonding pads are formed and electrically coupled to the conductive structures 233 for electrical connection. The structure 260 does not include an active device such as transistor, diodes, amplifiers, transmitters, circuits or other devices that may covert a signal into another signal.

The substrate 230 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example.

The materials and methods for forming the metallic layers 235, 245 and 255 may be similar to those of the metallic layer 211 shown in FIG. 2A. The materials and methods for forming the dielectric layers 240 and 250 may be similar to those of the dielectric layer 210 shown in FIG. 1A. The materials and methods for forming the conductive structures 243 and 245 may be contacts, vias, damascene structures or dual damascene structures which are similar to those of the contacts 209 shown in FIG. 2A.

The conductive structures 233 may comprise at least one dielectric layer (not shown), at least one barrier layer (not shown) and at least one conductive layer (not shown) formed in an opening that penetrates through the substrate 230. One end of the conductive structure 223 is coupled to the metallic layer 235 and another end of the conductive structure 223 is coupled to the pads 231. In some embodiments, the dielectric layer may be around the barrier layer and the barrier layer may be around the conductive layer.

The dielectric layer (not shown) may be, for example, an oxide layers nitride layer, oxynitride layer or other dielectric layer that is capable of isolating the conductive layer from the substrate 230. The dielectric layer may be formed by a chemical vapor deposition (CVD) process, for example. The barrier layer (not shown) may comprise, for example, a titanium (Ti) layer, titanium-nitride (TiN) layer, tantalum (Ta) layer, tantalum-nitride (TaN) layer or other material layer that is capable of reducing or preventing metallic ions of the conductive layer from diffusing into the surrounding regions of the substrate 230. The barrier layer may be formed by, for example, a CVD or physical vapor deposition (PVD) process. The conductive layer may comprise, for example, an Al layer, Cu layer, AlCu layer, polysilicon layer or other conductive material layer. The conductive layer (not shown) can be formed by, for example, a CVD process, PVD process, electrochemical plating process, electro-less plating process or other process that is able to form a conductive layer. In some embodiments, methods for forming the conductive structures 233 within the substrate 230 are described in, for example, commonly assigned and copending U.S. patent application Ser. No. 11/563,973, filed on Nov. 28, 2006 and U.S. patent application Ser. No. 11/539,814, filed on Oct. 9, 2006, the entirety of which is hereby incorporated by reference herein. It is noted that the number of the metallic layers 235, 245 and 255 are not limited by the example in FIG. 2B. One, two or more than three metallic layers may be formed over the substrate 230.

In some embodiments for forming the conductive structures 233, i.e., TSV structures, the dielectric layers 240, 250, metallic layers 235, 245, 255 and conductive structures 243, 253 are formed over a bulk substrate (not shown). TSV structures (not shown) are then formed within the bulk substrate. The bulk substrate with the TSV structures is then subjected to a backside milling process to thin the bulk substrate so as to form the substrate 230 with the conductive structures 233 formed therein. The pads 231 are then formed and coupled to the conductive structures 233.

Referring to FIG. 2C, the structure 260 shown in FIG. 2B is bonded over the structure 201 shown in FIG. 2A. The method for bonding the structures 201 and 260 may comprise a fusion process at a temperature of about 400° C. After the bonding of the structure 201 and the structure 260, a single die 270 having four metallic layers 213, 235, 245 and 255 is formed. Accordingly, if the single die, i.e., the structure 270, may comprise a predetermined N (e.g., 4) metallic layers, the structure 201 may comprise m (e.g., 1) metallic layers, the structure 260 may comprise n (e.g., 3) metallic layers and N is equal to the sum of m and n. In some embodiments, more than two structures are stacked together. For example, another substrate (not shown) may comprise p (e.g., 3) metallic layers. The another substrate is bonded over the substrate 260. Accordingly, the number of the metallic layers of the stacked structure may be 7 (1+3+3).

In some embodiments, the structure 260 may be flipped and bonded with the structure 201. The pads (not labeled) of the metallic layer 255 are bonded with the pads 213 of the structure 201.

Figure 5A:
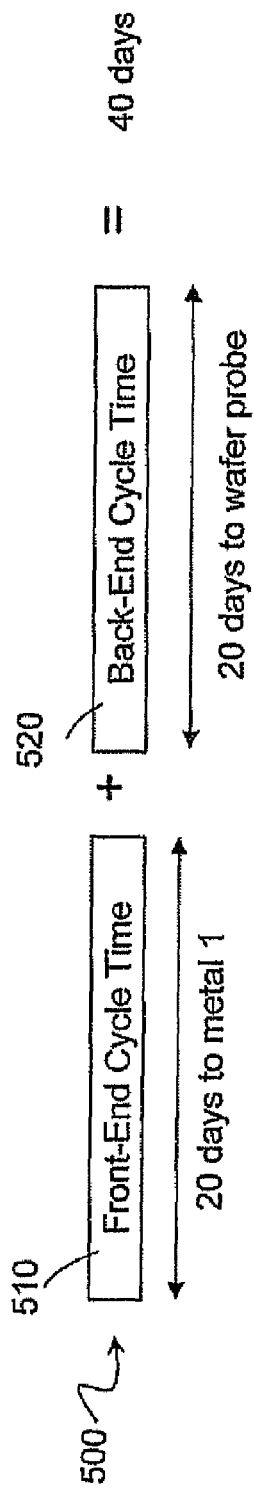
FIG. 5A is a schematic cross-sectional view showing the time needed to form a traditional single die with a multi-layer interconnection structure, e.g., 4 metallic layers.
Figure 5B:
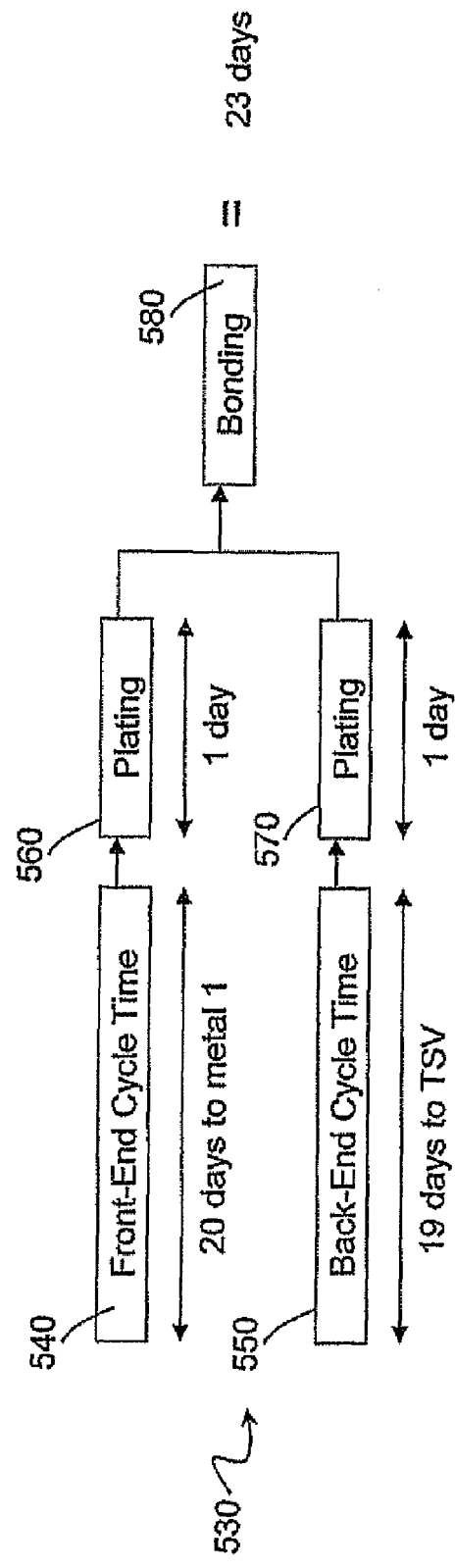
FIG. 5B is a schematic cross-sectional view showing the time needed to form an exemplary single die with a multi-layer interconnection structure formed by an exemplary method.

FIG. 5A is a schematic drawing showing the time needed to form a traditional single die with a multi-layer interconnection structure, e.g., 4 metallic layers. FIG. 5B is a schematic drawing showing the time needed to form an exemplary single die with a multi-layer interconnection structure formed by and exemplary method.

Referring to FIG. 5A, a traditional process includes a front-end-of line (FEOL) process 510 and a back-end-of-line (BEOL) process 520. The FEOL cycle time from providing a blank substrate to forming the first metallic layer 111 (shown in FIG. 1A) may be about 20 days, for example. The BEOL cycle time from forming the first metallic layer 111 to forming the fourth metallic layer 155 (shown in FIG. 1A) may be, for example, about 20 days. The device 102 and metallic layers 111, 135, 145 and 155 must be formed sequentially. In other words, the full cycle time for forming a single die having the multi-layer interconnect structure is the sum of the FEOL cycle time and the BEOL cycle time, and may cost about 40 days, for example.

Referring to FIG. 5B, an exemplary process 530 may include two parallel processes: FEOL process 540 and BEOL process 550. The FEOL process 540 is provided to form the structure 201 (shown in FIG. 2A) and the BEOL process 550 is provided to form the structure 260 (shown in FIG. 2B). The FEOL cycle time from providing a blank substrate (provided to form the substrate 200) to forming the first metallic layer 211 may be, for example, about 20 days. The BEOL cycle time from providing a blank substrate (provided to form the substrate 230) to forming the conductive structure 233, i.e., the TSV structure, may be about 19 days, for example. The plating process 560 is provided to form the pads 213 (shown in FIG. 2A) and the plating process 570 is provided to form the pads 231 (shown in FIG. 2B). The cycle time of the plating processes 560 and 570 may be about 1 day. Then, the bonding process 580 bonds the structures 201 and 260 so as to form the single die 270 (shown in FIG. 2C). Since the structures 201 and 260 are formed on different substrates 200 and 230, respectively, the processes 540 and 550 for forming the structures 201 and 260, respectively, can be conducted simultaneously, or the processes can overlap each other. There is no need to wait for completion of FEOL processing to begin BEOL processing. The BEOL processing can begin as soon as the corresponding equipment and materials are available. The cycle time for forming both of the structures 201 and 260 may be about 20 days. Including the cycle time of the plating processes 560, 570 and the cycle time of the bonding process 580, the total cycle time of forming the single die 270 may be about 23 days. Compared with the 40-day cycle time of the traditional process, the processes provided in FIGS. 2A-2C may substantially reduce the cycle time by about 40%.

Since the structure 260 does not include an active device, the substrate provided to form the substrate 230 may be a reclaimed substrate, wafer or other substrate having desired quality. Accordingly, the costs for forming the structure 260 or the single die 270 can be desirably reduced. In some embodiments, the structures 201 and 260 can be formed by different generation techniques. For example, the structure 201 may be formed by 65-nm technique and the structure 260 may be formed by 0.13-μm technique as long as the structures 201 and 206 can be desirably bonded to each other, Accordingly, the costs for forming the structure 260 or the single die 270 can be desirably reduced.

It is also noted that the single die 270 formed by the processes shown in FIGS. 2A-2C may also improve the yield of wafers. Semiconductor chips with multi-layer interconnect structures are subjected to particles and/or defects during formation of various device layers and metallic layers. In general, as more metallic layers are required in a given design, more failed chips or dies are found. For example, the yield of the process 510 (shown in FIG. 5A) may be about 60% and the yield of the process 520 (shown in FIG. 5A) may be about 80%. Accordingly, the sequential processes 510 and 520 forming the single die 101 may have a yield of about 48% (60%×80%). Unlike the traditional process, the structures 201 and 260 shown in FIGS. 2A and 2B, respectively, are formed and tested separately. Even if the yield of the process 540 (shown in FIG. 5B) may be about 60% and the yield of the process 550 (shown in FIG. 5B) may be about 80%, the tested known good structure 260 (shown in FIG. 2B) formed by the process 550 (shown in FIG. 5B) can be provided to bond with the tested known good structure 201 (shown in FIG. 2A). Accordingly, the yield can be maintained at the greater of the two individual yields (in this example, about 60%). In addition, the remaining 20% tested known good structures 260 can be kept and used for bonding with other tested known good structures 201. Accordingly, fewer wafers are used to manufacture any given quantity of the structures 260. The number of wafers for manufacturing the structures can 260 thus be reduced.

Figure 3A:
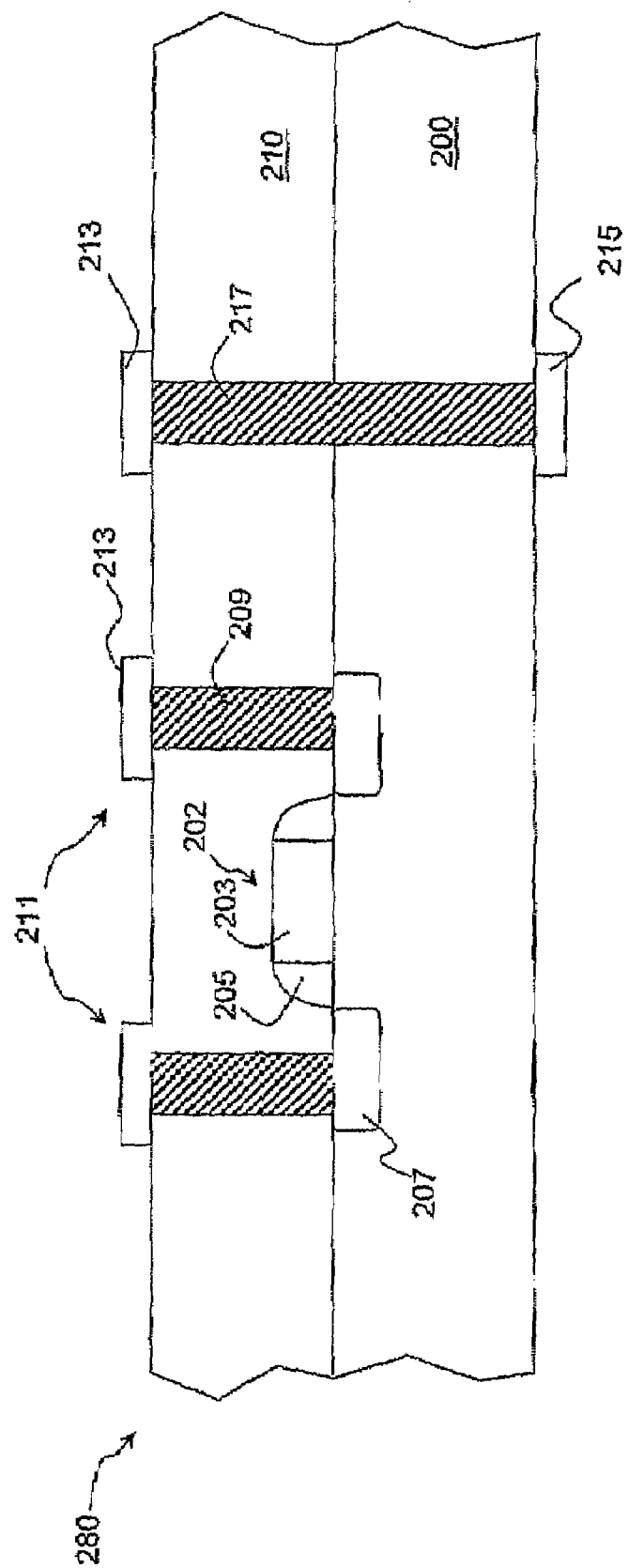
FIGS. 3A-3C are schematic cross-sectional views showing an exemplary method for forming an exemplary single die.
Figure 3B:
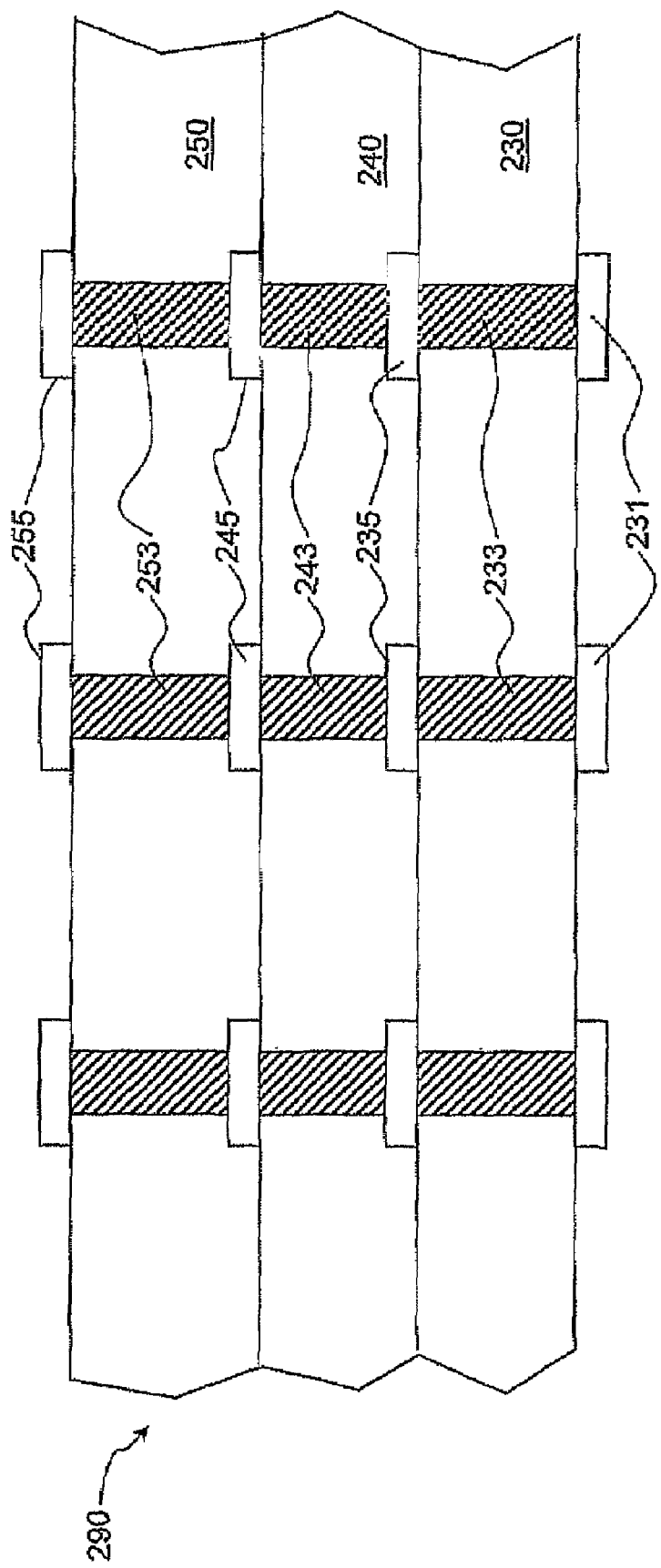
Figure 3C:
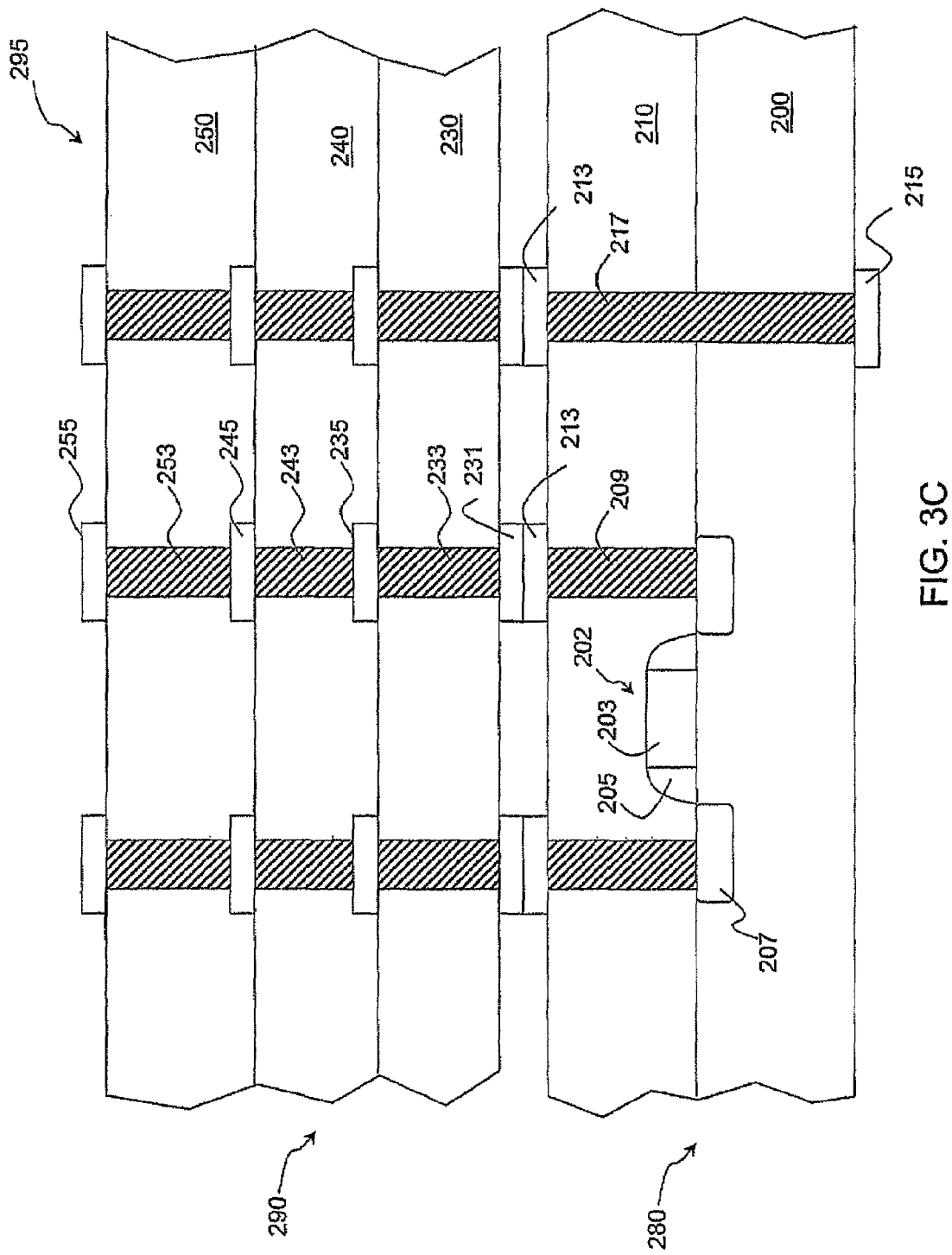

FIGS. 3A-3C are schematic cross-sectional views showing an exemplary method for forming an exemplary single die.

Referring to FIG. 3A, the structure 280 may comprise at least one conductive structure 217, e.g., TSV structure. The conductive structure 217 is formed within and through the dielectric layer 210 and the substrate 200. The materials and methods for forming the conductive structure 217 may be similar to those of the conductive structure 233 (shown in FIG. 213). In some embodiments, at least one pad 215 such as a bonding pad may be formed and electrically coupled to the pad 213 through the conductive structure 217. In some embodiments, the materials and methods for forming the pad 215 may be similar to those of the pad 231 described in FIG. 2B.

In some embodiments for forming the conductive structure 217, i.e., TSV structures, the device 202, dielectric layer 210, metallic layer 211 and contacts 209 are formed over a bulk substrate (not shown). TSV structures (not shown) are then formed within the bulk substrate and the dielectric layer 210. The bulk substrate with the TSV structure is then subjected to a backside milling process to thin the bulk substrate so as to form the substrate 200 with the conductive structure 217 formed therein. The pad 215 is then formed and coupled to the conductive structures 217.

Referring to FIG. 3B, the structure 290 may include the metallic layers 235, 245 and 255 sequentially formed over the substrate 230 and the dielectric layers 240 and 250, respectively.

Referring to FIG. 3C, the structures 280 and 290 may be bonded by a fusion process so as to form a single die 295. By the bonding process, the active device 202 may be electrically coupled to the pads (not labeled) on the metallic layer 255 through the contacts 209, pads 213, 231, conductive structures 233 (i.e., TVS), metallic layers 235, 245 and conductive structures 243, 253. In some embodiments, the active device 202 may be electrically coupled to the pad 215 through the contacts 209, metallic layer 211 and conductive structure 217 (i.e., TVS). In some embodiments, the pads (not labeled) on the metallic layer 255 and/or the pad 215 may be bonded with other substrates, wafers or circuit boards.

Figure 4A:
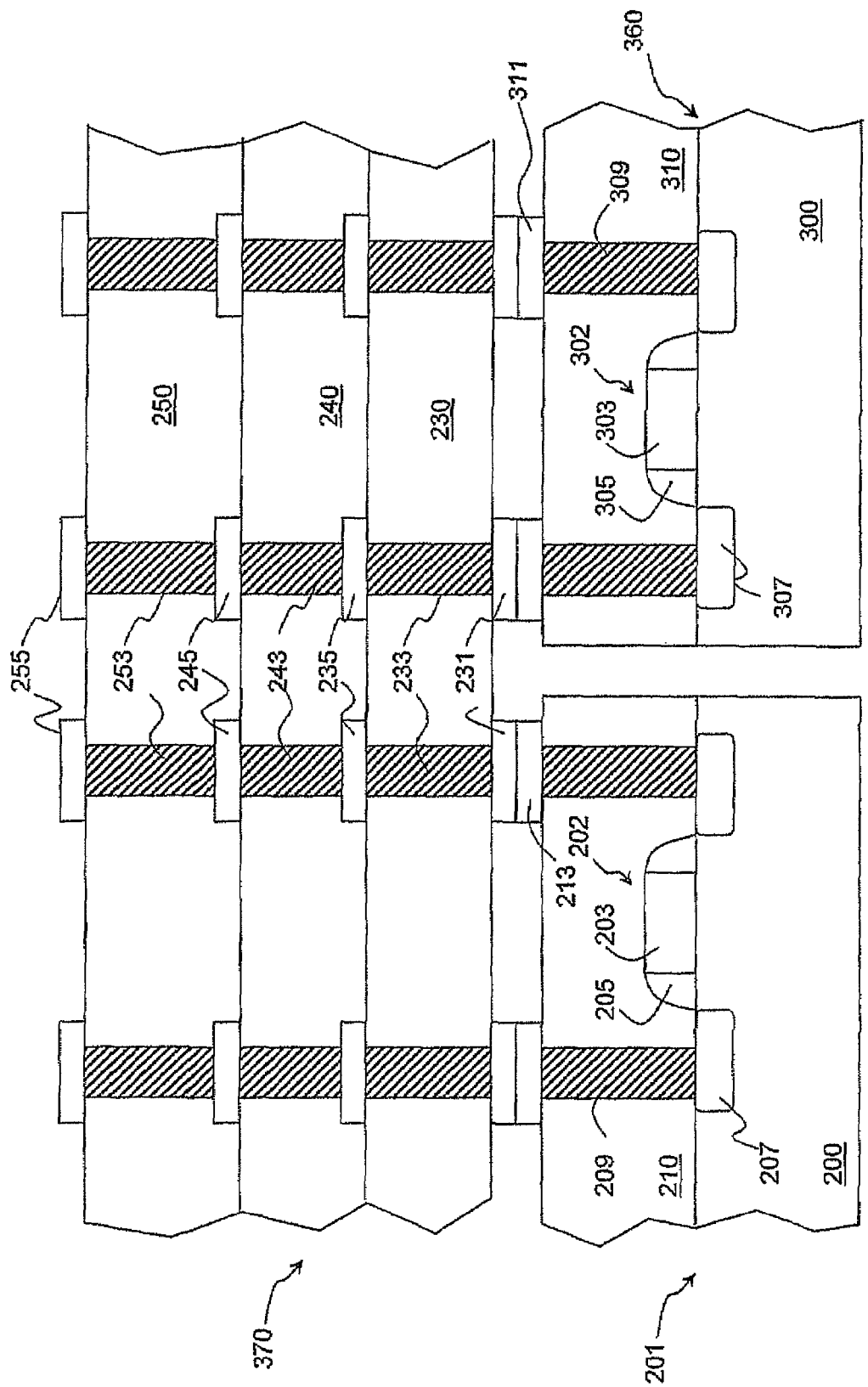
FIG. 4A is a schematic cross-sectional view showing an exemplary stacked structure.

FIG. 4A is a schematic cross-sectional view showing an exemplary stacked structure. In this structure, a plurality of first substrates 201, 360 undergo a first set of processes (e.g., BEOL processing); a second substrate 370 undergoes a second set of processes (e.g., FEOL processing); and the first substrates 201, 360 and second substrate 370 are joined to form a single die.

Referring to FIG. 4A, the structure 360 may comprise a substrate 300. At least one gate 303 is formed over the substrate 300. Spacers 305 may be formed on the sidewalls of the gate 303. S/D regions 307 are formed within the substrate 300 and adjacent to the gate 303. A dielectric layer 310 is formed over the substrate 300, covering the gate 303. Contacts 309 are formed within the dielectric layer 310. At least one metallic layer 311 comprising pads 313 such as bonding pads is formed over the dielectric layer 310. The materials and methods for forming the substrate 300, the gate 303, spacers 305, the S/D regions 307, the contacts 309, the metallic layer 311 and pads 313 may similar to those of the substrate 200, the gate 203, the spacers 205, the S/D regions 207, the contacts 209, the metallic layer 211 and the pads 213, respectively.

The structures 201 and 360 are bonded with the structure 370. After the bonding, the active device 202 may be electrically coupled to the active device 302 through the pads 213, 231, the conductive routes (not shown) of the metallic layers 235, 245 and/or 255 and the conductive structures 233 (i.e., TVS structures) and conductive structures 243, 253. The pads (not labeled) of the metallic layer 255 can be electrically bonded with other substrates, wafers or circuit boards.

The method shown in FIG. 4A allows more complete use of good devices. The portion of the single die formed by the FEOL processes (and containing the active regions) can be divided into a plurality of substrates or substrate portions. A defect in one substrate portion 201 will not prevent use of the neighboring substrate portion 360, or substitution of another instance of the same substrate portion 201. The yield can be improved. For example, if the yield of substrate portion 201 is 60% and the yield of substrate portion 360 is 80%, then the overall yield will be 60%. In contrast, if the active regions 202 and 302 were formed in a single substrate, the yield of region 202 is 60%, and the yield of region 302 is 80%, then the overall yield would only be 48%.

Figure 4B:
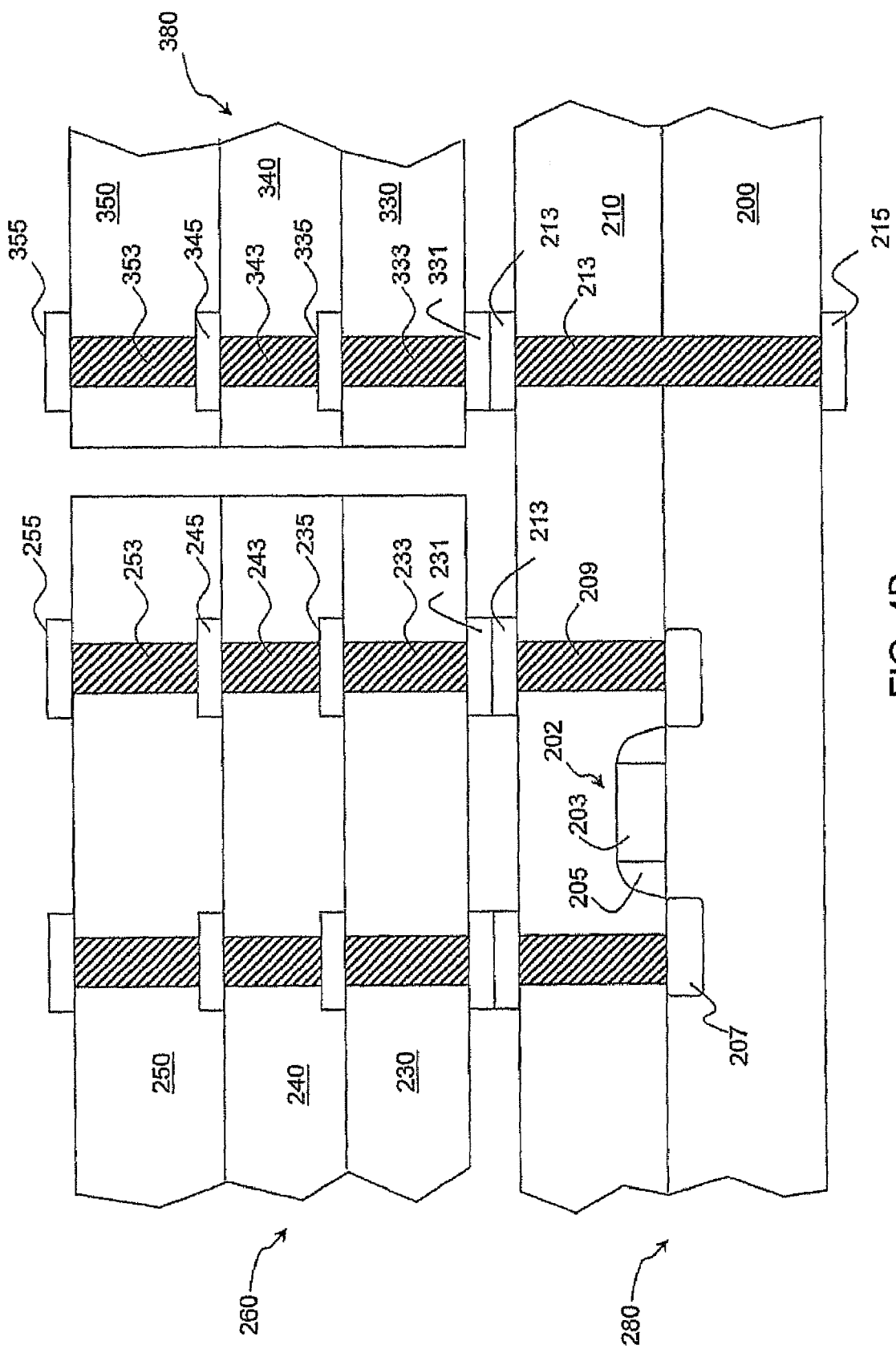
FIG. 4B is a schematic cross-sectional view showing another exemplary stacked structure.

FIG. 4B is a schematic crosssectional view showing another exemplary stacked structure. In this structure, a first substrate 280 undergoes a first set of processes (e.g., BEOL processing); a plurality of second substrates 260, 380 undergo a second set of processes (e.g., FEOL processing); and the first substrate 280 and second substrates 260, 380 are joined to form a single die.

Referring to FIG. 4B, the structure 380 may comprise a substrate 330. At least one metallic layer such as metallic layers 335, 345 and 355 are formed over the substrate 330 and the dielectric layers 340 and 350, respectively. Conductive structures 343 and 353 such as vias, contacts, damascene structures or dual damascene structures are formed within the dielectric layers 340 and 350, respectively. At least one conductive structure 333, i.e., TSV structure, is formed within and through the substrate 330. At least one pad 331 is formed and electrically coupled to the conductive structure 333, The materials and methods forming the substrate 330, pad 331, conductive structure 333, dielectric layers 340, 350, conductive structures 343, 353 and metallic layers 335, 345, 355 are similar to those of the substrate 230, pad 231, conductive structure 233, dielectric layers 240, 250, conductive structures 243, 253 and metallic layers 235, 245, 255, respectively.

The structures 260 and 380 are bonded with the structure 280. After the bonding, the metallic layer 255 may be electrically coupled to the metallic layer 355 through the pads 213, 231, 331, the conductive routes (not shown) of the metallic layers 235, 245, 335 and/or 345 and the conductive structures 233, 333 (i.e., TVS structures) and conductive structures 243, 253, 343 and/or 355. The pads (not labeled) of the metallic layers 255 and 355 and/or the pad 215 can be electrically bonded with other substrates, wafers or circuit boards.

The method shown in FIG. 4B allows more complete use of good interconnect structures. The portion of the single die formed by the BEOL processes (and containing the intermetal dielectric, or IMD, layers) can be divided into a plurality of substrates or substrate portions. A defect in one substrate portion 260 will not prevent use of the neighboring substrate portion 380, or substitution of another instance of the same substrate portion 260. The yield can be improved, for example, where there are yield problems in the IMD layers. Yield issues with the IMD layers are expected to take on greater significance as the use of low-K, extreme low-K ELK) and ultra-low-K (ULK) dielectric materials increases.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method for forming a single die, comprising:
   forming at least one first active device over a first substrate and at least one first metallic layer coupled to the first active device and extending above a top surface of a top dielectric layer of the first substrate, said forming including performing front-end-of-line processing (FEOL) steps on the first substrate without performing back-end-of-line (BEOL) processing on the first substrate;
   forming at least one second metallic layer extending over an exposed substrate surface of a second substrate, wherein the second substrate does not include any active device, and the step of forming at least one second metallic layer includes performing BEOL processing steps but no FEOL processing steps on the second substrate;
   forming at least one through-silicon-via (TSV) structure in the second substrate; and
   bonding the at least one first metallic layer with the at least one second metallic layer using fusion, such that the first substrate and the second substrate constitute a single die.

2. The method of claim 1 further comprising forming at least one through-silicon-via (TSV) structure in the first substrate.

3. The method of claim 1 further comprising:
   forming at least one second active device over a third substrate and at least one third metallic layer coupled to the second active device; and binding the at least one second metallic layer with the at least one third metallic layer, such that the first substrate and the third substrate are arranged laterally adjacent one another.

4. The method of claim 1 further comprising:
forming at least one third metallic layer over a third substrate, wherein the third substrate does not include any active device; and
binding the at least one first metallic layer with the at least one third metallic layer.

5. The method of claim 1, wherein the single die has a predetermined N metallic layers, the at least one first metallic layer has m metallic layers, the at least one second metallic layer has n metallic layers and N is equal to the sum of m and n.

6. The method of claim 1, wherein the first metallic layer and the second metallic layer are formed by different generations of semiconductor techniques.

7. The method of claim 1, wherein:
the step of forming at least one second metallic layer includes performing back-end-of-line processing steps on the second substrate without performing FEOL processing on the second substrate.

8. A single die, comprising:
a first substrate including front-end-of-line (FEOL) processing layers including at least one first active device and at least one first metallic layer and without back-end-of-line (BEOL) processing layers over the FEOL layers;
a second substrate with at least one second metallic layer disposed thereon, wherein the second substrate does not include any active device;
at least one second active device coupled to at least one third metallic layer formed over a third substrate; and
the first substrate and the third substrate are disposed laterally adjacent one another and the first metallic layer and the third metallic layer are each bonded to the second metallic layer to constitute a single die having contacts formed over each of opposed top and bottom surfaces.

9. The single die of claim 8, wherein the first substrate comprises at least one through-silicon-via (TSV) structure formed therein.

10. The single die of claim 8, wherein the second substrate comprises at least one through-silicon-via (TSV) structure formed therein.

11. The single die of claim 8 further comprising:
at least one third metallic layer formed over a third substrate, wherein the third substrate does not include any active device and the at least one first metallic layer is bonded with the at least one third metallic layer.

12. The single die of claim 8, wherein a portion of the single die has a predetermined N metallic layers where the first metallic layer is bonded to the second metallic layer, the at least one first metallic layer has m metallic layers, the at least one second metallic layer has n metallic layers and N is equal to the sum of m and n.

13. A single die, comprising:
a first substrate including at least one active device disposed thereon and front-end-of-line (FEOL) processing layers without back-end-of-line (BEOL) processing layers over the FEOL layers;
one first metallic layer coupled to the active device formed over a first exposed surface of the first substrate;
a second substrate including at least one active device disposed thereon and second front-end-of-line (FEOL) processing layers without back-end-of-line (BEOL) processing layers over the second FEOL layers;
one second metallic layer coupled to the active device formed over a second exposed surface of the second substrate; and
a third substrate comprising at least one third metallic layer and disposed over the first metallic layer and over the second metallic layer such that the third metallic layer is in confronting relation with the first and second exposed surfaces, wherein the third substrate does not have any active device and includes at least one through-silicon-via (TSV) structure extending therein and the first, second and third substrates combine to form said single die having contacts formed over each of opposed top and bottom surfaces of said single die.

14. The single die of claim 13, wherein the first substrate comprises at least one through-silicon-via (TSV) structure formed therein.

15. The single die of claim 13, wherein the second substrate comprises at least one through-silicon-via (TSV) structure formed therein.

16. The single die of claim 13 further comprising:
at least one fourth metallic layer formed over a fourth substrate, wherein the fourth substrate does not include any active device and at least the first metallic layer or the second metallic layer is bonded with the at least one fourth metallic layer.

17. The method of claim 1, further comprising milling to produce the exposed substrate surface of the second substrate, prior to the forming at least one second metallic layer.

* * * * *

UNITED STATES PATENT AND TRADEMARK OFFICE
CERTIFICATE OF CORRECTION

PATENT NO.        : 7,795,735 B2
APPLICATION NO.   : 11/689264
DATED             : September 14, 2010
INVENTOR(S)       : Chao-Shun Hsu et al.

It is certified that error appears in the above-identified patent and that said Letters Patent is hereby corrected as shown below:

Column 2, line 16, replace "die," with --die.--
Column 3, line 2, replace "SI D" with --S/D--
Column 3, line 26, replace "like" with --like.--
Column 4, line 15, replace "1A" with --2A--
Column 4, line 30, replace "layers" with --layer,--
Column 5, line 24, replace "and" with --an--
Column 6, line 12, replace "other," with --other.--
Column 6, line 52, replace "FIG. 213" with --FIG. 2B--
Column 7, line 59, replace "crosssectional" with --cross-sectional--
Column 8, line 8, replace "structure 333," with --structure 333.--
Column 8, line 20, replace "355" with --353--
Column 8, line 35, replace "ELK)" with --(ELK)--
Column 10, line 19, replace "lavers" with --layers--

Signed and Sealed this
Thirty-first Day of May, 2011

David J. Kappos
*Director of the United States Patent and Trademark Office*